(12) United States Patent
Tang et al.

(10) Patent No.: US 9,778,688 B2
(45) Date of Patent: Oct. 3, 2017

(54) FLEXIBLE SYSTEM-IN-PACKAGE SOLUTIONS FOR WEARABLE DEVICES

(71) Applicant: INTEL CORPORATION, Santa Clara, CA (US)

(72) Inventors: Jiamiao Tang, Shanghai (CN); Junfeng Zhao, Shanghai (CN); Michael P. Skinner, San Jose, CA (US); Yong She, Minghang (CN); Jiun Hann Sir, Gelugor (MY); Bok Eng Cheah, Bayan Lepas (MY); Shanggar Periaman, Gelugor (MY); Kooi Chi Ooi, Glugor (MY); Yen Hsiang Chew, Georgetown (MY)

(73) Assignee: INTEL CORPORATION, Santa Clara, CA (US)

( * ) Notice: Subject to any disclaimer, the term of this patent is extended or adjusted under 35 U.S.C. 154(b) by 10 days.

(21) Appl. No.: 14/779,300

(22) PCT Filed: Nov. 12, 2014

(86) PCT No.: PCT/CN2014/090939
§ 371 (c)(1),
(2) Date: Sep. 22, 2015

(87) PCT Pub. No.: WO2016/074176
PCT Pub. Date: May 19, 2016

(65) Prior Publication Data
US 2016/0327977 A1 Nov. 10, 2016

(51) Int. Cl.
*H01L 23/48* (2006.01)
*G06F 1/16* (2006.01)
(Continued)

(52) U.S. Cl.
CPC ............... *G06F 1/163* (2013.01); *A41B 1/00* (2013.01); *A41D 1/06* (2013.01); *A41D 1/08* (2013.01);
(Continued)

(58) Field of Classification Search
CPC ............ H01L 23/3135; H01L 21/4853; H01L 21/565; H01L 23/49838; H01L 25/0655;
(Continued)

(56) References Cited

U.S. PATENT DOCUMENTS 5,386,342 A 1/1995 Rostoker
7,453,157 B2 * 11/2008 Haba ................... H01L 23/3128
174/522

(Continued)

FOREIGN PATENT DOCUMENTS

CN 1641873 A 7/2005
CN 1808702 A 7/2006
(Continued)

OTHER PUBLICATIONS

International Search Report and Written Opinion mailed Jul. 28, 2015, issued in corresponding International PCT Application PCT/CN2014/090939, 12 pages.

(Continued)

*Primary Examiner* — Alexander Oscar Williams
(74) *Attorney, Agent, or Firm* — Schwabe, Williamson & Wyatt, P.C.

(57) ABSTRACT

Embodiments of the present disclosure are directed towards an integrated circuit (IC) package. In embodiments, an integrated circuit (IC) package may include a flexible substrate. The flexible substrate may have a plurality of dies coupled therewith. The IC package may include a first encapsulation material, having a first rigidity, disposed on the flexible substrate to at least partially encapsulate each die
(Continued)

of the plurality dies. The IC package may further include a second encapsulation material, having a second rigidity, disposed on the flexible substrate. In embodiments, the second rigidity and the first rigidity are different from one another. Other embodiments may be described and/or claimed.

24 Claims, 11 Drawing Sheets

(51) Int. Cl.
| | |
|---|---|
| H01L 23/31 | (2006.01) |
| A41B 1/00 | (2006.01) |
| A41D 1/06 | (2006.01) |
| A41D 1/08 | (2006.01) |
| A41F 9/00 | (2006.01) |
| A43B 3/00 | (2006.01) |
| A43B 7/14 | (2006.01) |
| A44C 5/00 | (2006.01) |
| A44C 15/00 | (2006.01) |
| F03G 5/06 | (2006.01) |
| G06F 1/18 | (2006.01) |
| H01L 21/48 | (2006.01) |
| H01L 21/56 | (2006.01) |
| H01L 23/498 | (2006.01) |
| H01L 23/00 | (2006.01) |
| H01L 25/065 | (2006.01) |
| H01L 25/00 | (2006.01) |
| H02J 1/14 | (2006.01) |
| H05K 1/18 | (2006.01) |

(52) U.S. Cl.
CPC .............. *A41F 9/002* (2013.01); *A43B 3/001* (2013.01); *A43B 3/0015* (2013.01); *A43B 7/141* (2013.01); *A44C 5/0015* (2013.01); *A44C 15/005* (2013.01); *F03G 5/06* (2013.01); *G06F 1/189* (2013.01); *H01L 21/4853* (2013.01); *H01L 21/565* (2013.01); *H01L 23/3135* (2013.01); *H01L 23/4985* (2013.01); *H01L 23/49838* (2013.01); *H01L 23/562* (2013.01); *H01L 25/0655* (2013.01); *H01L 25/50* (2013.01); *H02J 1/14* (2013.01); *H05K 1/189* (2013.01); *H01L 2224/16225* (2013.01); *H01L 2224/48091* (2013.01); *H01L 2224/73257* (2013.01); *H01L 2924/0002* (2013.01); *H01L 2924/181* (2013.01); *H05K 2201/05* (2013.01)

(58) Field of Classification Search
CPC ... H01L 23/4985; H01L 25/50; H01L 23/562; G06F 1/163; G06F 1/189; A43B 3/0015; A43B 7/141; A43B 3/001; A41B 1/00; A41B 1/08; H02J 1/14; F03G 5/06; H05K 2201/05; H05K 1/189
USPC .................................. 257/787, 788, 789, 790
See application file for complete search history.

(56) References Cited

U.S. PATENT DOCUMENTS

| | | | |
|---|---|---|---|
| 8,193,042 B2 | 6/2012 | Fjelstad | |
| 9,253,884 B2* | 2/2016 | Jezewski | H05K 1/0393 |
| 2008/0195817 A1* | 8/2008 | Hiew | G06K 19/077 |
| | | | 711/115 |
| 2009/0162593 A1* | 6/2009 | Kotulla | B44C 3/123 |
| | | | 428/39 |
| 2011/0260857 A1* | 10/2011 | Hamill | A43B 3/0005 |
| | | | 340/539.13 |
| 2013/0015472 A1* | 1/2013 | Lo | H01L 25/0753 |
| | | | 257/88 |
| 2013/0134922 A1 | 5/2013 | Takagi | |
| 2014/0180624 A1 | 6/2014 | Nikonov et al. | |
| 2015/0186705 A1* | 7/2015 | Magi | G06K 9/0002 |
| | | | 382/125 |
| 2016/0026853 A1* | 1/2016 | Wexler | G02B 27/0093 |
| | | | 382/103 |
| 2016/0098137 A1* | 4/2016 | Kim | G06F 1/1643 |
| | | | 345/173 |
| 2016/0291637 A1* | 10/2016 | Rondel | G06F 1/163 |
| 2016/0327979 A1* | 11/2016 | Lettow | G06F 1/163 |
| 2016/0338441 A1* | 11/2016 | London | A43B 3/001 |
| 2016/0374608 A1* | 12/2016 | Dugan | A61B 5/4343 |
| | | | 600/301 |

FOREIGN PATENT DOCUMENTS

| | | |
|---|---|---|
| CN | 10-2254898 A | 11/2011 |
| CN | 10-3809492 A | 5/2014 |
| JP | 1976109468 A | 9/1976 |
| JP | H03503342 A | 7/1991 |
| JP | 06-102374 A | 4/1994 |
| JP | 0927573 A | 1/1997 |
| JP | 11-250377 A | 9/1999 |
| JP | 11250377 | 9/1999 |
| JP | 2000-067200 A | 3/2000 |
| JP | 260814 A * | 9/2000 |
| JP | 2002190486 A | 7/2002 |
| JP | 2010230410 A | 10/2010 |
| KR | 100824738 B1 | 4/2008 |
| WO | WO2013/032512 A1 | 3/2013 |
| WO | WO2013/097075 A1 | 7/2013 |

OTHER PUBLICATIONS

Search Report mailed Aug. 5, 2016 for TW Patent Application No. 104133054, 2 pages.
Office Action mailed Jan. 4, 2017 for Japanese Patent Application No. 2016-558248, 12 pages.
Office Action dated Jul. 6, 2017 for Korean Patent Application No. 2015-7028230, 18 pages.
Office Action dated Aug. 8, 2017 for Japanese Patent Application No. 2016-558248, 10 pages.

* cited by examiner

FLEXIBLE SYSTEM-IN-PACKAGE SOLUTIONS FOR WEARABLE DEVICES

CROSS-REFERENCE TO RELATED APPLICATION

The present application is a national phase entry under 35 U.S.C. §371 of International Application No. PCT/CN2014/090939, filed Nov. 12, 2014, entitled "FLEXIBLE SYSTEM-IN-PACKAGE SOLUTIONS FOR WEARABLE DEVICES," which designates the United States of America, the entire disclosure of which is hereby incorporated by reference in its entirety and all purposes.

FIELD

Embodiments of the present disclosure generally relate to the field of integrated circuits, and more particularly, to apparatuses and methods associated with flexible system-in-package solutions for wearable devices.

BACKGROUND

Multi-chip semiconductor packages for wearable computing devices such as clothing, wristbands, necklaces, etc. may need to be flexible or bendable to properly fit the contours of a user and for the comfort of the user. Continuous bending of a package assembly may cause an attached die to crack or delaminate or may cause tearing of a bendable substrate, which could damage the wearable device. Under the current state of the art, a rigid mold compound may be applied on the package assembly to stiffen the package in an effort to prevent die cracking delamination and substrate tearing; however such rigid mold compound also removes the flexibility of the package, thus making the entire assembly unsuitable for use in a flexible wearable device.

The background description provided herein is for the purpose of generally presenting the context of the disclosure. Unless otherwise indicated herein, the materials described in this section are not prior art to the claims in this application and are not admitted to be prior art by inclusion in this section.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings. Unless clearly indicated otherwise, these drawings are not to scale.

DETAILED DESCRIPTION

Figure 1:
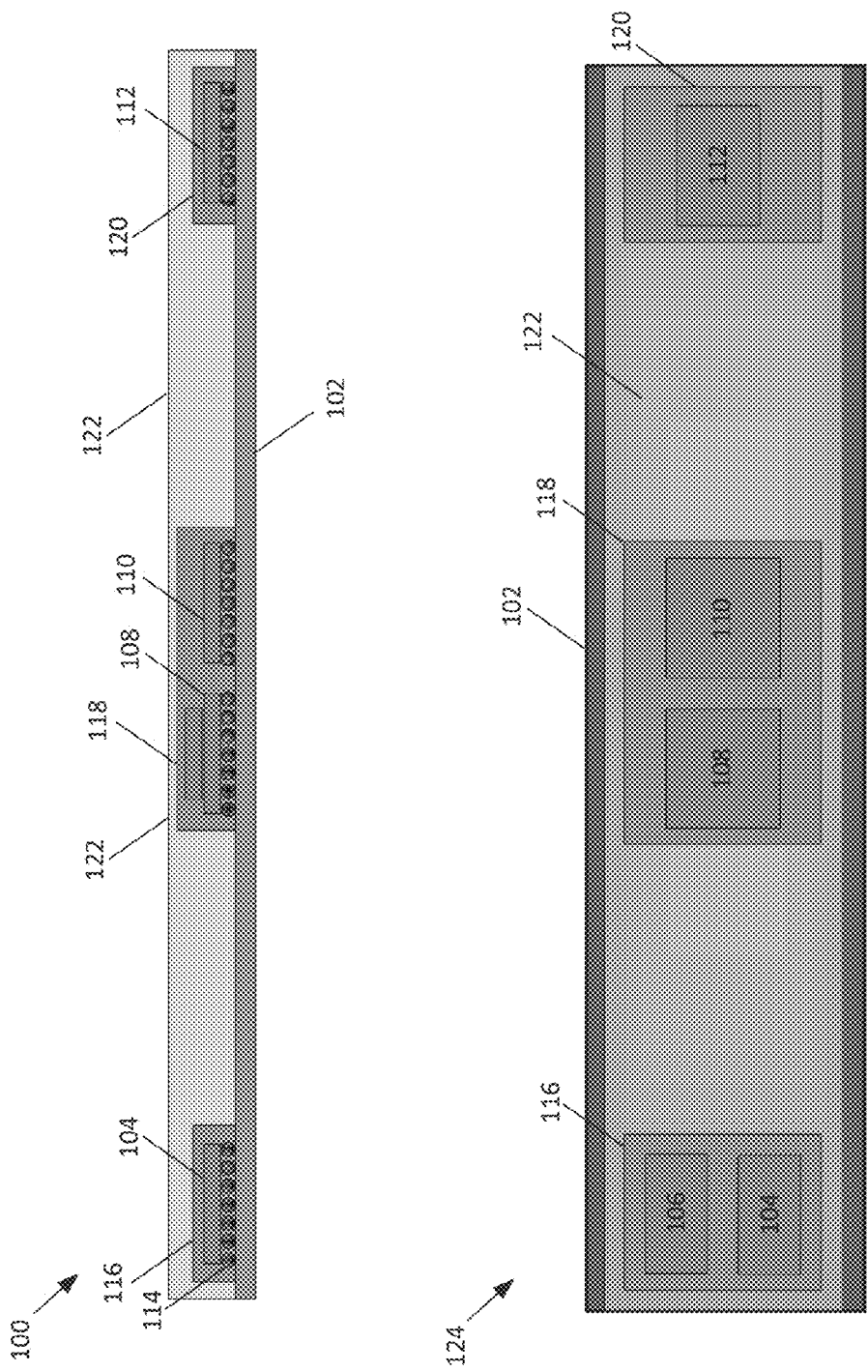
FIG. 1 schematically illustrates a cross-section side view and a top-down view of an example integrated circuit (IC) package having both a rigid and a flexible mold compound disposed thereon, in accordance with various embodiments of the present disclosure.

Embodiments of the present disclosure describe integrated circuit (IC) package configurations having both rigid and flexible mold compound disposed thereon. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature," may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a system-on-chip (SoC), a processor (shared, dedicated, or group), and/or memory (shared, dedicated, or group) that execute one or more software or firmware programs, a combinational logic circuit, and/or other suitable components that provide the described functionality.

FIG. 1 schematically illustrates a cross-section side view 100 and a top-down view 124 of an example integrated circuit (IC) package. In embodiments, the IC package may include a plurality of dies (e.g., dies 104-112) electrically and/or physically coupled with a flexible substrate 102, as can be seen. The IC package may include a first encapsulation material (e.g., encapsulation material 116-120) disposed at locations on the flexible substrate to at least partially encapsulate dies 104-112, as can be seen. In addition, the IC package may also include a second encapsulation material 122 disposed on flexible substrate 102. In embodiments, as depicted, the second encapsulation material 122 may at least partially encapsulate first encapsulation material 116-120. In embodiments, the first and second encapsulation materials may be designed to have a different level of rigidity from one another. For example, in some embodiments, the first encapsulation material may have a level of rigidity that is greater than a level of rigidity of the second encapsulation material, as discussed below.

In embodiments, first encapsulation material 116-120 may be a substantially rigid encapsulation material. As used herein, a substantially rigid encapsulation material may include encapsulation materials that have a rigidity designed to prevent cracking or delamination of the plurality of dies 104-112. Such a rigidity may vary depending on the composition of the plurality of dies and/or the anticipated application of the IC package. The first encapsulation material may include any encapsulation materials, or combinations thereof, that would be considered substantially rigid.

Second encapsulation material 122 may, on the other hand, be a substantially flexible encapsulation material. As used herein a substantially flexible encapsulation material may include encapsulation material designed to prevent tearing or fraying of the flexible substrate, while maintaining a level of flexibility of IC package 100. Such substantially flexible encapsulation material may include, but is not limited to, poly siloxanes, epoxy resins, acrylates (e.g., poly methyl methacrylate, both ultraviolet curable and $O_2/H_2O$ initiated), polyurethanes, benzocyclobutene (BCB), polyimide, polyamide, high-density polyethylene (HDPE), bismaleimide-triazine (BT) resin, liquid crystal polymer (LCP), aramid, polydimethylsiloxane (PDMS), polyester, fiberglass epoxy. In some embodiments, the first encapsulation material 116-120 and the second encapsulation material 122 may include the same materials, however, these materials may be included in different ratios to result in the rigidity difference between the first and second encapsulation materials. For example, an illustrative first encapsulation material may be composed of A % of chemical/compound 1 and B % of chemical/compound 2, while an illustrative second encapsulation material may be composed of C % of chemical/compound 1 and D % of chemical/compound 2.

Flexible substrate 102 may, in some embodiments, be a flexible circuit board having electrical routing features disposed therein. In such embodiments, the electrical routing features may be configured to route electrical signals between the plurality of dies. Such a flexible circuit board may, in some embodiments, be a flexible printed circuit board (FPC). In other embodiments, the flexible substrate may function as a flexible package substrate with input/output (I/O) structures disposed thereon for signal breakout from IC package 100. Such a flexible substrate may include, but is not limited to, polyester, polyimide, aramid, glass, or any combination thereof.

In some embodiments, as depicted, the first encapsulation material and the second encapsulation material may be disposed on the same side of flexible substrate 102. In other embodiments, the first and second encapsulation materials may be disposed on opposite sides of flexible substrate 102, such as that depicted in FIG. 7. In addition, one or more additional encapsulation materials may also be disposed on flexible substrate 102 (e.g., those embodiments depicted in FIGS. 5-7).

Dies 104-112 may be coupled with flexible substrate 102 according to a variety of suitable configurations, including an embedded wafer-level ball grid array (eWLB), as depicted, or other configurations such as, for example, being embedded in the package substrate 102 or being configured in a wire-bonding arrangement. In the eWLB configuration, the dies 104-112 may be attached to a surface of the flexible substrate 102 via die interconnect structures (e.g., die interconnect structure 114) such as bumps, pillars, or other suitable structures that may also electrically couple dies 104-112 with the flexible substrate 102. Dies 104-112 may represent discrete chips made from a semiconductor material and may be, include, or be a part of a processor, memory, or ASIC in some embodiments.

Figure 4:
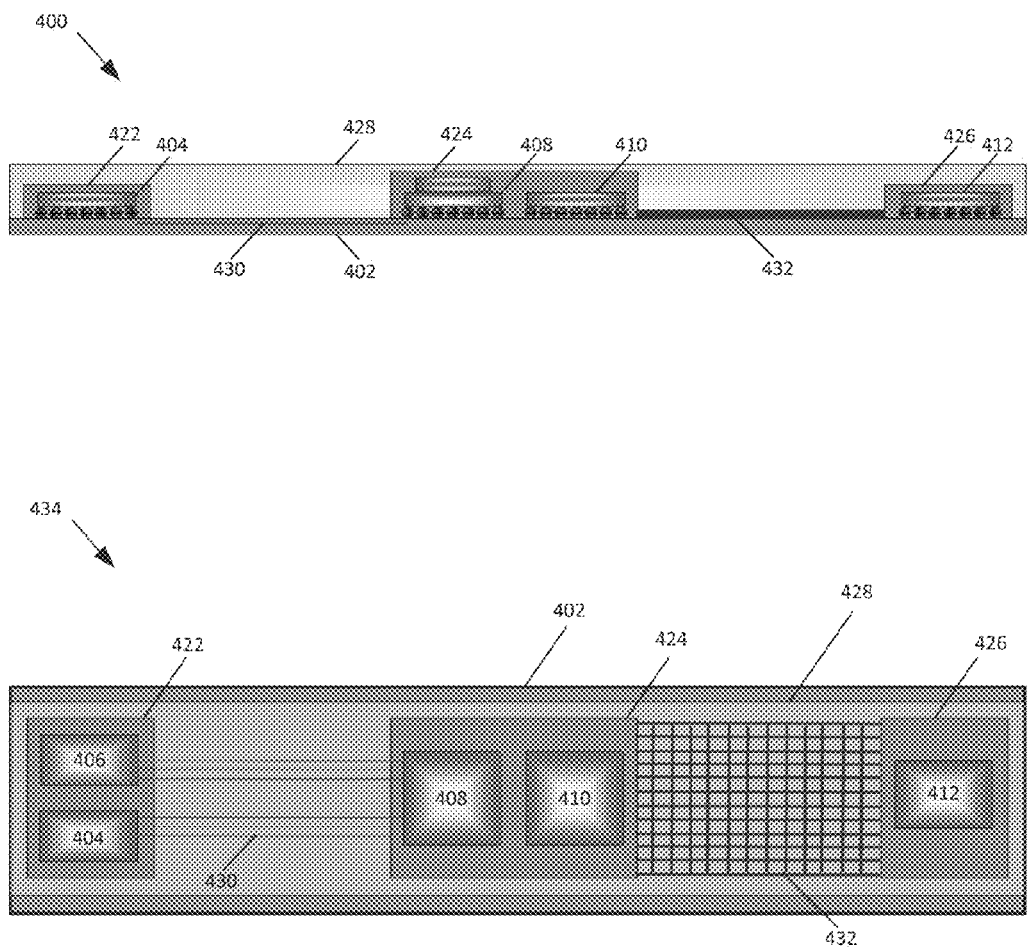
FIG. 4 schematically illustrates a cross-section side view and a top down view of an example integrated circuit (IC) package having both a rigid and a flexible mold compound disposed thereon with electrically conductive features and a wire mesh disposed therein, in accordance with various embodiments of the present disclosure.

As mentioned above, flexible substrate 102 may include electrical routing features configured to route electrical signals between dies 104-112. The electrical routing features may include, for example, traces disposed on one or more surfaces of flexible substrate 102 and/or internal routing features such as, for example, trenches, vias, or other interconnect structures to route electrical signals through flexible substrate 102. For example, in some embodiments, package substrate 102 may include electrical routing features (e.g., die bond pads) configured to receive the die interconnect structures 114 and route electrical signals between dies 104-112 and flexible substrate 102. In some embodiments, the flexible substrate 102 may be a polymer-based laminate coreless substrate having build-up layers such as, for example, polyester, polyimide and/or aramid substrate. In other embodiments, the flexible substrate may comprise wires or wire meshes (as shown in FIG. 4); wires or wire meshes encapsulated inside a flexible insulation material (e.g. elastomer material); redistribution metal layers such as a Bumpless Build-Up Layer (BBUL); alternating patterns of dielectric and conductive layers encapsulated within an elastomer or flexible mold compound; conductive fibers embroidered, stitched or weaved on a piece of fabric; or metal or conductive imprints on a fabric or plastic.

Figure 2:
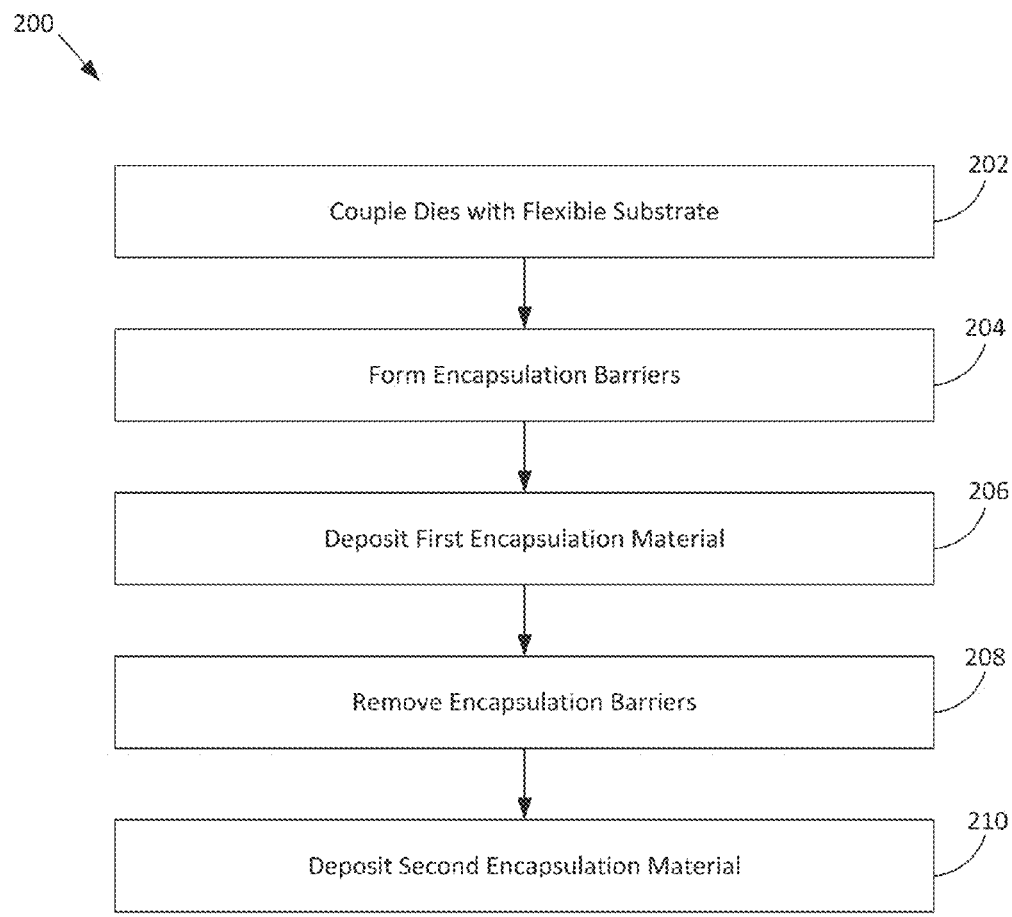
FIG. 2 is an illustrative flow diagram of an integrated circuit (IC) package fabrication process in accordance with various embodiments of the present disclosure.
Figure 3:
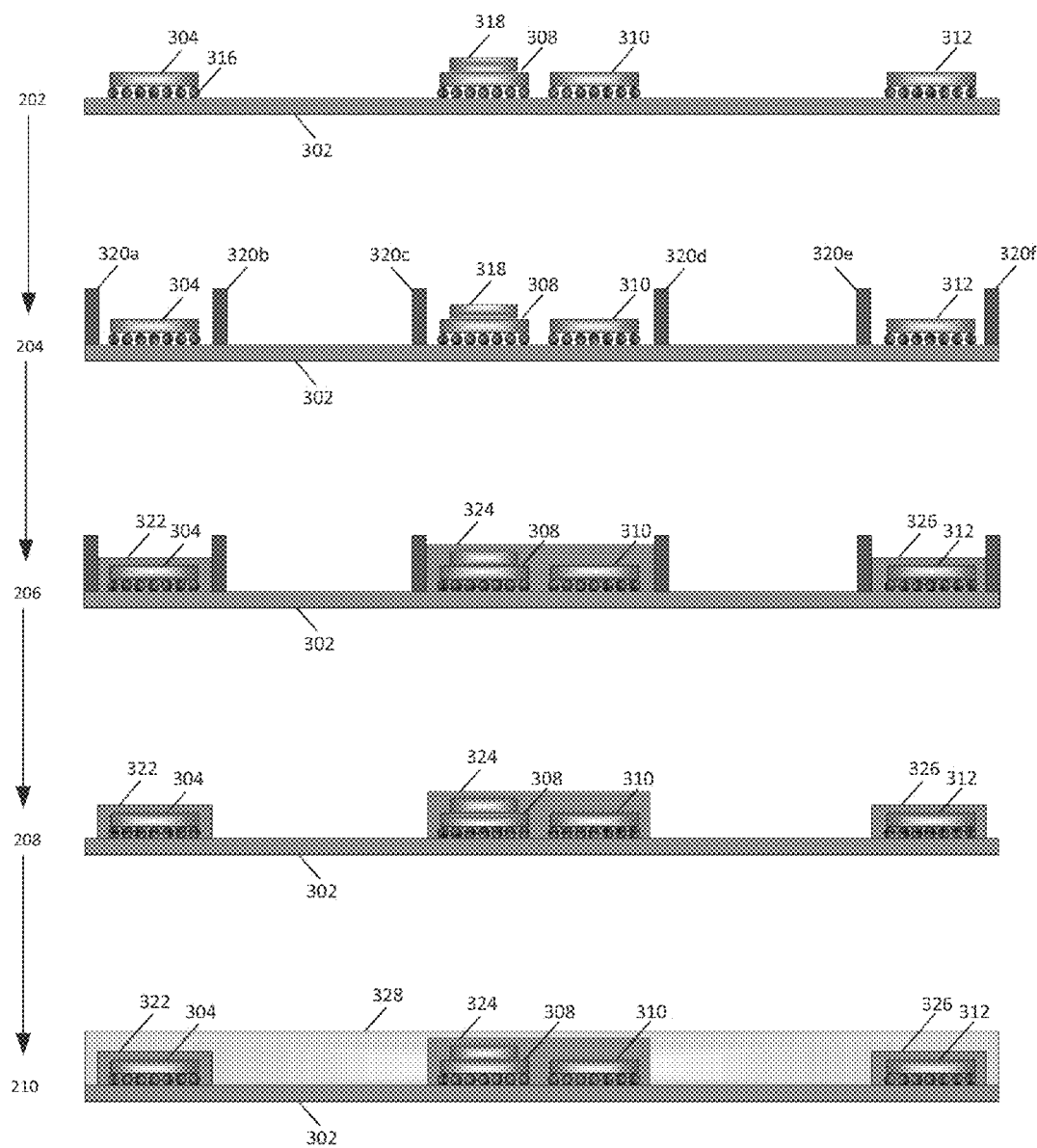
FIG. 3 depicts cross-section views of selected operations illustrating stages in the IC die fabrication process of FIG. 2, in accordance with various embodiments of the present disclosure.

FIG. 2 is an illustrative flow diagram of an integrated circuit (IC) package fabrication process in accordance with various embodiments of the present disclosure. FIG. 3 provides cross-section views of selected operations illustrating stages in IC package fabrication process 200, in accordance with various embodiments. As a result, FIGS. 2 and 3 will be described in conjunction with one another. To aid in this description, the operations performed in FIG. 2 are referenced on the arrows moving from operation to operation in FIG. 3. In addition, not all reference numbers may be depicted in each operation in FIG. 3.

The process may begin at block 202 where dies 304-312 may be coupled with a flexible substrate 302. Dies 304-312 may be any type or combination of dies, such as those discussed in reference to FIG. 1. In addition, the dies may be stacked dies, such as stacked die 318 which may be, for example, memory. In addition, flexible substrate 302 may be any type of flexible substrate, such as, for example, those discussed in reference to FIG. 1. Furthermore, as in FIG. 1, dies 304-312 may be coupled with the flexible substrate in accordance with any conventional configuration, such as, for example, surface activated bonding and solder balls (e.g., solder ball 316).

After block 202, the process may proceed to block 204 where encapsulation barriers 320a-320f may be formed and/or coupled with flexible substrate 302. Encapsulation barriers 320a-320f may be selected from any suitable material and may be coupled with flexible substrate 302 in accordance with any conventional adhesive. In some embodiments, encapsulation barriers 320a-320f may be formed into a metal chassis that may be depressed against a surface of flexible substrate 302 (e.g., for injection molding).

At block 206, a first encapsulation material 322-326 may be deposited onto the flexible substrate (e.g., via injection molding). Such a first encapsulation material 322-326 may be any substantially rigid encapsulation material, such as that discussed above in reference to FIG. 1. As can be seen the first encapsulation material may encapsulate at least a portion of dies 304-312. Once the first encapsulation material has cured, the encapsulation barriers may be removed at block 208.

At block 210, the second encapsulation material 328 may be deposited on flexible substrate 302. Such a second encapsulation material 328 may be any substantially flexible encapsulation material, such as that discussed above in reference to FIG. 1. As can be seen, second encapsulation material 328 may encapsulate at least a portion of the first encapsulation material.

FIG. 4 schematically illustrates a cross-section side view 400 and a top-down view 434 of an example integrated circuit (IC) package having both a rigid and a flexible mold compound disposed thereon with electrically conductive features 430 and a wire mesh 432 disposed therein, in accordance with various embodiments of the present disclosure.

The IC package of FIG. 4 depicts a substantially similar configuration to those discussed above. As can be seen, the IC package includes a plurality of dies 404-412 at least partially encapsulated in a first encapsulation material 422-426 disposed on flexible substrate 402 and a second encapsulation material disposed on flexible substrate 402. The IC package embodiment depicted in FIG. 4, differs, however, at the inclusion of electrically conductive features (e.g., wires 430 or wire mesh 432) to route electrical signals between dies 404-412. As can be seen, both electrically conductive features 430 and the wire mesh 432 may be at least partially encapsulated by the first and/or second encapsulation materials.

Figure 5:
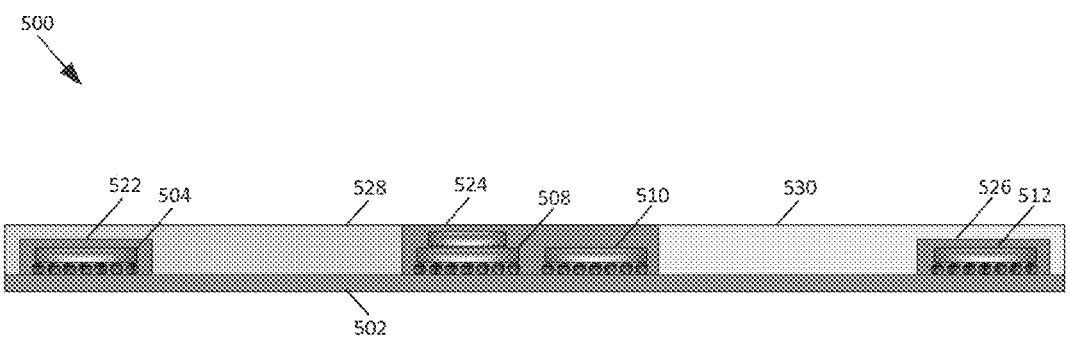
FIGS. 5-7 schematically illustrate cross-section side views of example integrated circuit (IC) packages having both a rigid and multiple different flexible mold compounds disposed thereon, in accordance with various embodiments of the present disclosure.
Figure 6:
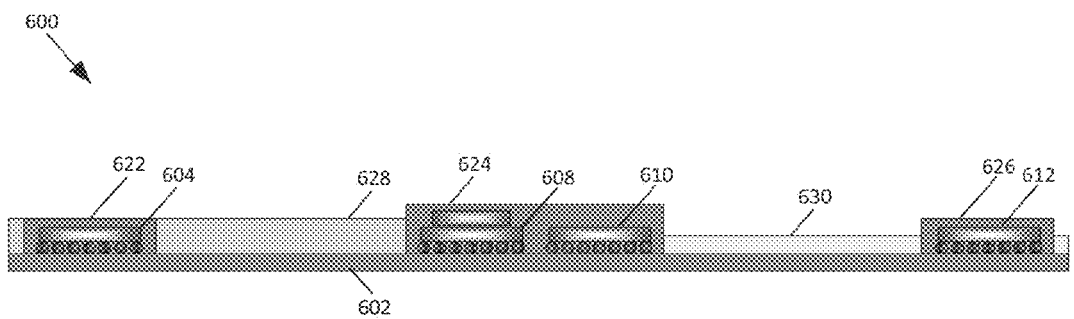
Figure 7:
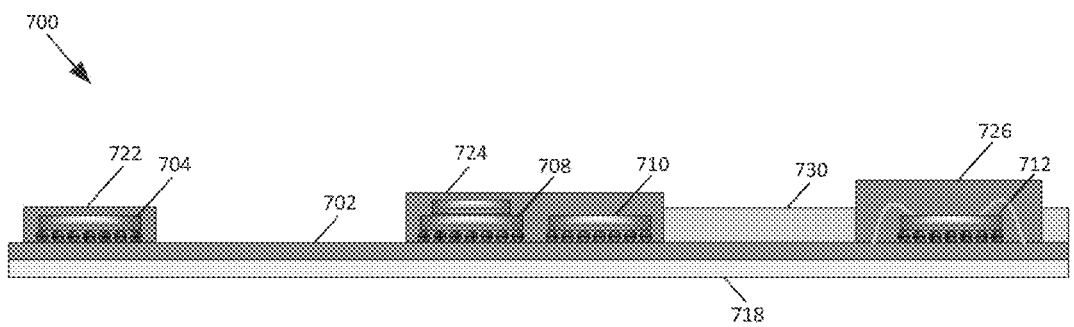

FIGS. 5-7 schematically illustrate cross-section side views of example integrated circuit (IC) packages having both a rigid and multiple different flexible mold compounds disposed thereon, in accordance with various embodiments of the present disclosure.

FIG. 5 depicts an integrated circuit package 500 having a plurality of dies 504-512 coupled with flexible substrate 502. As can be seen, the plurality of dies 504-512 may be at least partially encapsulated in first encapsulation material 522-526. This first encapsulation material 522-526 may have a first rigidity to protect dies 504-512 from cracking or delamination. IC package 500 may also include a second encapsulation material 528 that may have a second rigidity. Second encapsulation material 528 may protect the flexible substrate from tearing or fraying while allowing a degree of flexibility for IC package 500. In addition, IC package may include a third encapsulation material 530 that may have a third rigidity. In embodiments, the first rigidity, second rigidity, and third rigidity may all be different levels of rigidity and may vary depending on the application of the IC package 500.

FIG. 6 depicts an integrated circuit package 600 substantially similar to IC package 500, having a plurality of dies 604-612 coupled with flexible substrate 602. As can be seen, the plurality of dies 604-612 may be at least partially encapsulated in first encapsulation material 622-626. This first encapsulation material 622-626 may have a first rigidity to protect dies 604-612 from cracking or delamination. IC package 600 may also include a second encapsulation material 628 that may have a second rigidity. Second encapsulation material 628 may protect the flexible substrate from tearing or fraying while allowing a degree of flexibility for IC package 600. In addition, IC package may include a third encapsulation material 630 that may have a third rigidity. In embodiments, the first rigidity, second rigidity, and third rigidity may all be different levels of rigidity and may vary depending on the application of the IC package 600. IC package 600 differs from IC package 500 in that, as can be seen, the second and third encapsulation materials are formed at different thicknesses. This may be done, for example, to increase or decrease rigidity of IC package 600 at specific locations.

FIG. 7 depicts an integrated circuit package 700 similar to IC packages 500 and 600 discussed above. IC package 700 may have a plurality of dies 704-712 coupled with flexible substrate 702. As can be seen, die 712 may be coupled with flexible substrate 702, in part, by way of a wire-bonding arrangement. As can also be seen, the plurality of dies 704-712 may be at least partially encapsulated in first encapsulation material 722-726. This first encapsulation material 722-726 may have a first rigidity to protect dies 704-712 from cracking or delamination. IC package 700 may also include a second encapsulation material 718 that may have a second rigidity. As can be seen, second encapsulation material 718 may be disposed on a backside of flexible substrate 702 that is opposite the side of flexible substrate 702 having the plurality of dies 704-712 disposed thereon. Second encapsulation material 718 may protect the flexible substrate from tearing or fraying while allowing a degree of flexibility for IC package 700. In addition, in some embodiments, IC package 700 may include a third encapsulation material 730 that may have a third rigidity. In embodiments, the first rigidity, second rigidity, and third rigidity may all be different levels of rigidity and may vary depending on an intended application of IC package 700.

Figure 8:
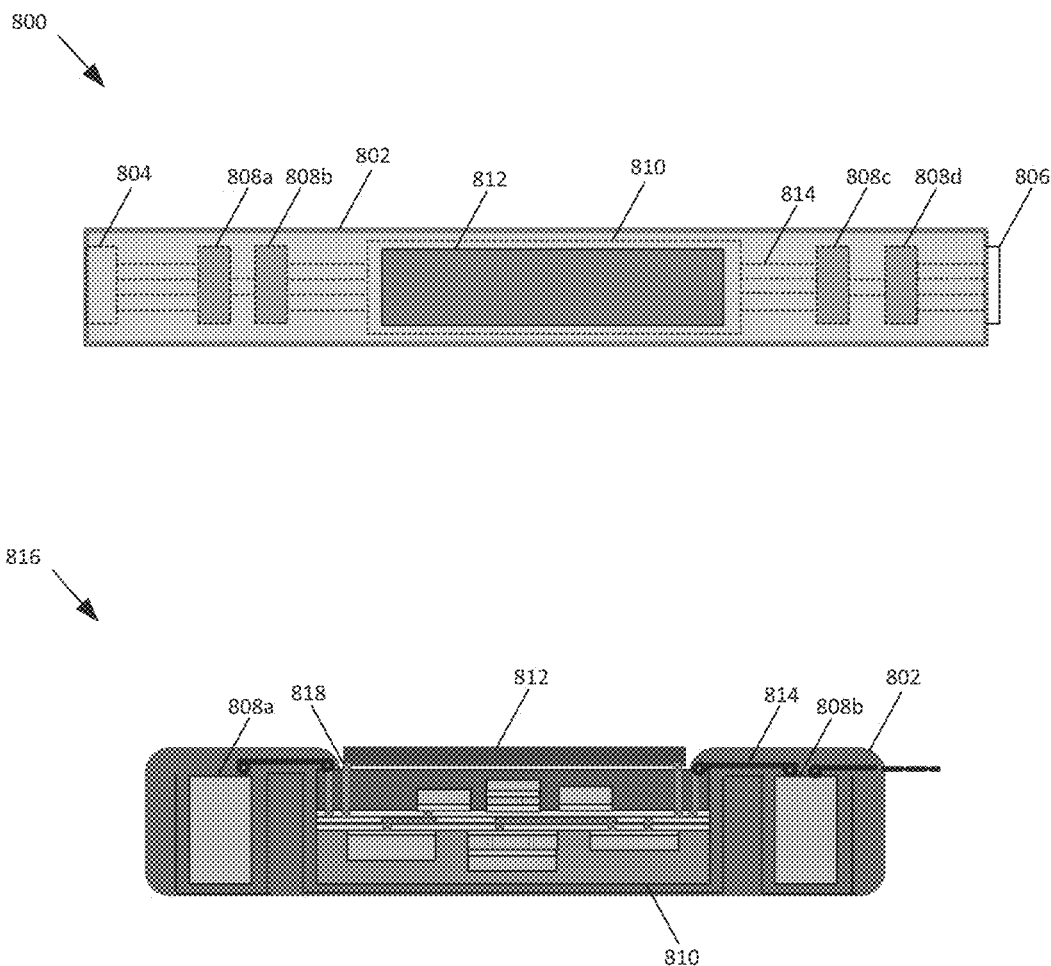
FIG. 8 is an illustrative diagram and cross-section side view of a system-in-package (SiP) having a display integrated therewith, in accordance with various embodiments of the present disclosure.

FIG. 8 is an illustrative top-down diagram 800 and cross-section side view 816 of a wearable article 802 having a system-in-package (SiP) 810 with a display 812 integrated therewith, in accordance with various embodiments of the present disclosure. In embodiments, SiP 810 may be produced utilizing the process flows described in reference to FIG. 2, above, or, as depicted, FIG. 9, below. The wearable article may be, for example, a bracelet, as depicted. The wearable article may have a female latch 804 on one end of the bracelet and a corresponding male connector 806 on an opposite end of the bracelet. The female latch 804 and the male connector 806 may be coupled with one another to form a clasp when wearing the wearable article. In addition, the male connector 806 or the female latch 804 may also act as a charging and/or data exchange port (e.g., micro USB port).

Wearable article 802 may also include one or more components (e.g., components 808a-808d). These components may be communicatively coupled with one another and SiP 810 by way of electrical routing features (e.g., electrical routing feature 814), embedded in wearable article 802. In embodiments, these electrical routing features may be micro-cable routing features. In such embodiments, the micro-cable may provide for shorter interconnects between components 808a-808d and SiP 810. Components 808a-808d may include any type of electronic component including, accelerometers, gyroscopes, global positioning sensors (GPS), memory modules, power supply modules, etc. In addition, while 4 components are depicted, it will be appreciated that this number is merely meant to be illustrative and that any number of components may be included without departing from the scope of this disclosure.

In embodiments, display 812 may be integrated with wearable article by way of interconnect structures (e.g. interconnect structure 818) that may be formed in SiP 810, as described in reference to FIG. 9, below. In embodiments, display 812 may be a flexible display. In some embodiments, display 812 may be a flexible touch display.

Figure 9:
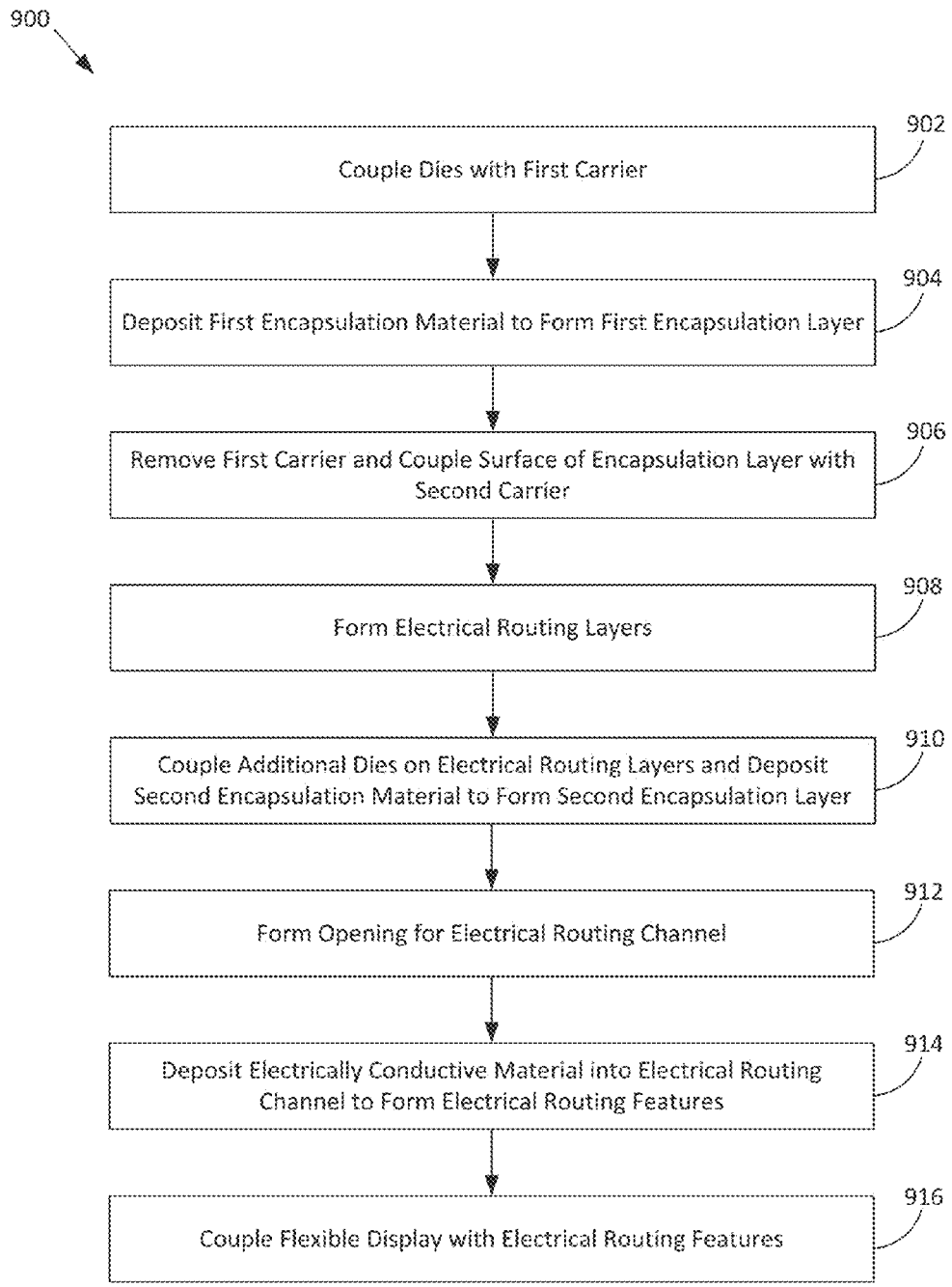
FIG. 9 is an illustrative flow diagram of an integrated circuit (IC) package fabrication process in accordance with various embodiments of the present disclosure.
Figure 10:
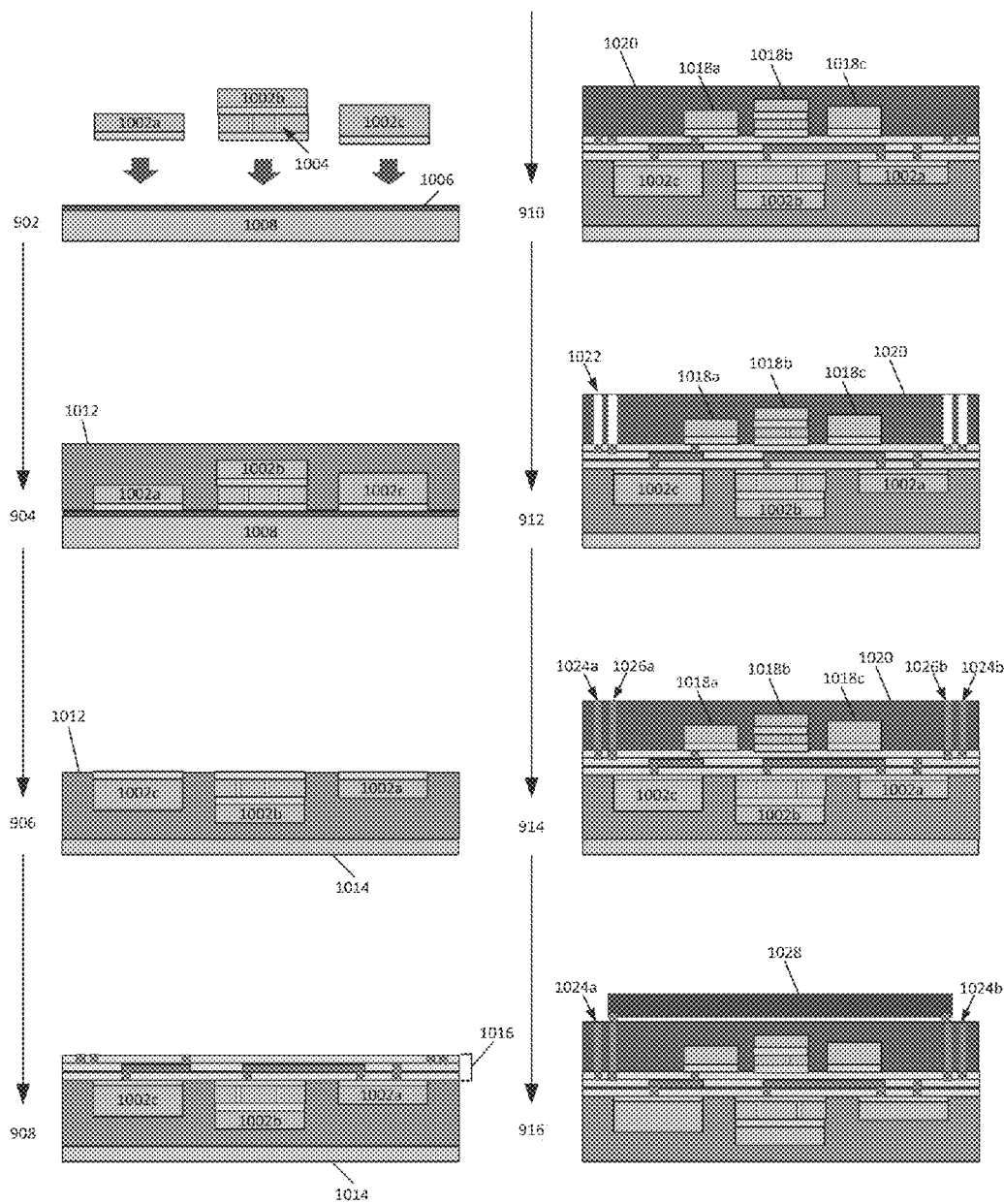
FIG. 10 is illustrative cross-section views of selected operations illustrating stages in the IC die fabrication process of FIG. 9, in accordance with various embodiments of the present disclosure.

FIG. 9 is an illustrative flow diagram of an integrated circuit (IC) package fabrication process in accordance with various embodiments of the present disclosure. FIG. 10 provides cross-section views of selected operations illustrating stages in IC package fabrication process 900, in accordance with various embodiments. As a result, FIGS. 9 and 10 will be described in conjunction with one another. To aid in this description, the operations performed in FIG. 9 are referenced on the arrows moving from operation to operation in FIG. 10. In addition, not all reference numbers may be depicted in each operation in FIG. 10.

The process may begin at block 902 where dies 1002a-c may be coupled with carrier 1008. In embodiments, this may be accomplished through the use of an adhesive layer 1006 applied to carrier 1008. In such embodiments, any conventional adhesive may be utilized in coupling dies 1002a-c to carrier 1008. In embodiments, dies 1002a-c may include one or more processors, memory, sensors, etc. As depicted, one or more of the dies may be stacked having a plurality of dies stacked together, (e.g., die 1002b) with through silicon vias (TSVs) (e.g., TSV 1004) incorporated for signal breakout.

At block 904 a first encapsulation material 1012 may be deposited over dies 1002a-c to at least partially encapsulate dies 1002a-c in the first encapsulation material 1012. First encapsulation material may be composed of any suitable material, such as, for example, a flexible material such as an elastomer, or any of other suitable materials discussed above in reference to FIG. 1. In addition, while not depicted in this figure, the process for encapsulating dies discussed in reference to FIGS. 2 and 3 may be utilized, in some embodiments, to provide for additional protection of the dies from cracking or delamination while maintaining flexibility of the resulting package.

At block 906 carrier 1008 may be de-bonded from dies 1002a-c and encapsulation material 1012. After the carrier is de-bonded, the package assembly may be flipped and a surface of first encapsulation material may be coupled with another carrier 1014 for the remainder of the assembly process. As can be seen, at block 908 electrical routing layers 1016 may be formed on active sides of dies 1002a-c. Such electrical routing layers 1016 may be formed through the formation of electrically insulative layers, such as polyimide layers, and electrical routing features embedded therein. Such a process may be carried out, for example, utilizing a photolithography build-up process.

At block 910 additional dies 1018a-c may be coupled with the electrical routing layers and a second encapsulation material 1020 may be deposited thereon. Second encapsulation material 1020 may be composed of any suitable material, such as, for example, a flexible material like an elastomer, or any of other suitable materials discussed above in reference to FIG. 1. In addition, while not depicted in this figure, the process for encapsulating dies discussed in reference to FIGS. 2 and 3 may be utilized, in some embodiments, to provide for additional protection of the dies from cracking or delamination while maintaining flexibility of the resulting package.

At block 912, one or more electrical routing channels (e.g., electrical routing channel 1022) may be formed. Such electrical routing channels may be formed, for example, through an etching process. After the electrical routing channels are formed, at block 914, electrically conductive material (e.g., copper, aluminum, etc.) may be deposited into the electrical routing channels to form electrical routing features 1024a-b and 1026a-b in a surface of second encapsulation material 1020. Such electrically conductive material may be any suitable electrically conductive material, such as, for example, copper, aluminum, etc.

At block 916 flexible display may be coupled with electrical routing features 1026a-b (e.g., via solder). Electrical routing features 1024a-b may in turn be utilized for other connections, such as, for example, power supply connections.

Figure 11:
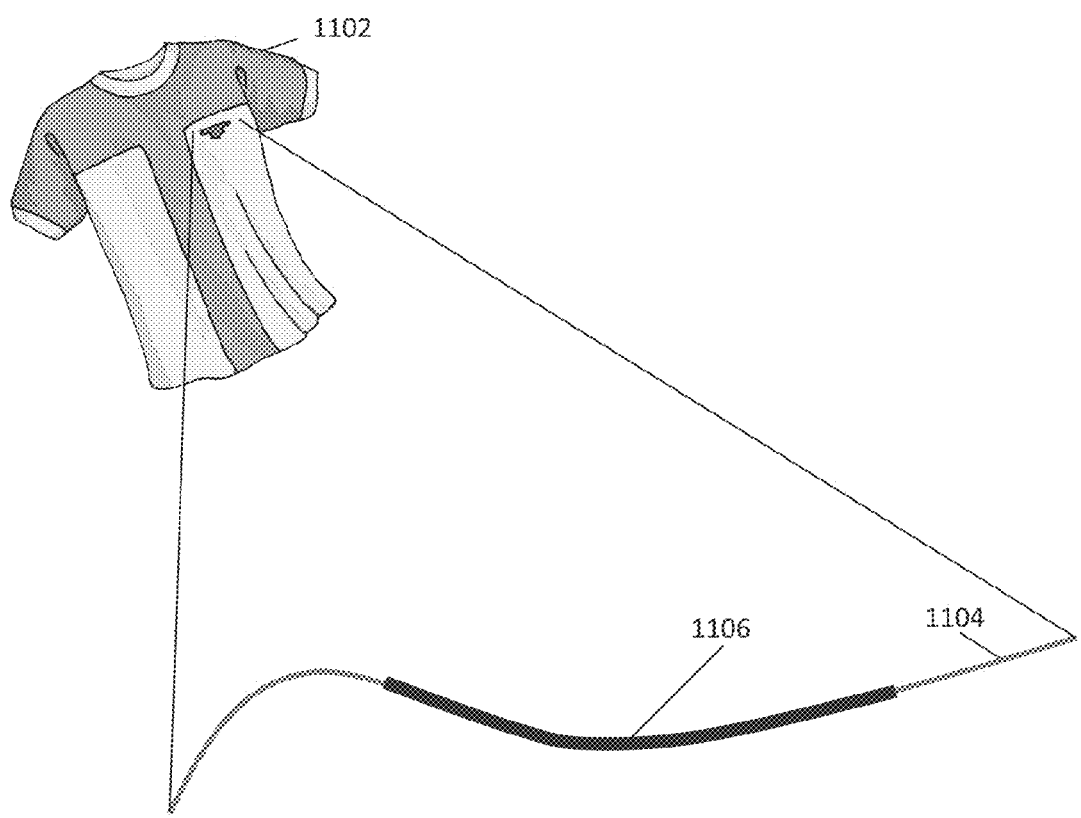
FIGS. 11-12 depict various wearable articles having an IC package integrated therewith, in accordance with various embodiments of the present disclosure.
Figure 12:
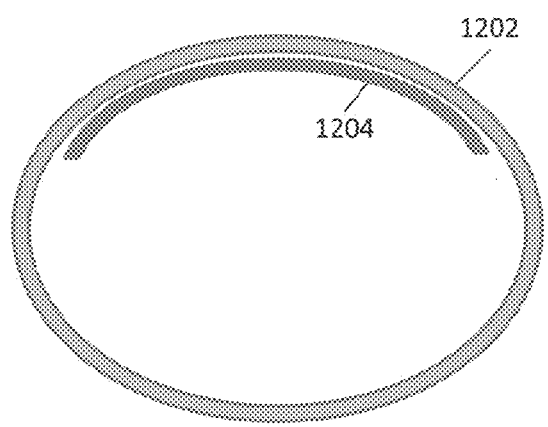

FIGS. 11-12 depict various wearable articles having an IC package integrated therewith, in accordance with various embodiments of the present disclosure. FIG. 11 depicts a shirt 1102 as a wearable article having an IC package 1106 disposed on fabric 1104. IC package 1106 may be produced through any of the above described process flows. FIG. 12, depicts a bracelet 1202 having an IC package 1204 disposed on, or embedded in, bracelet 1202. IC package 1204 may also be produced through any of the above described process flows. While depicted in FIGS. 11 and 12 as a shirt and a bracelet, it will be appreciated that a wearable article may be anything that may be worn by a person, such as an orthotic insert, shorts, pants, a watch, a necklace, a belt, jewelry, or shoe 1300 of FIG. 13 etc.

Figure 13:
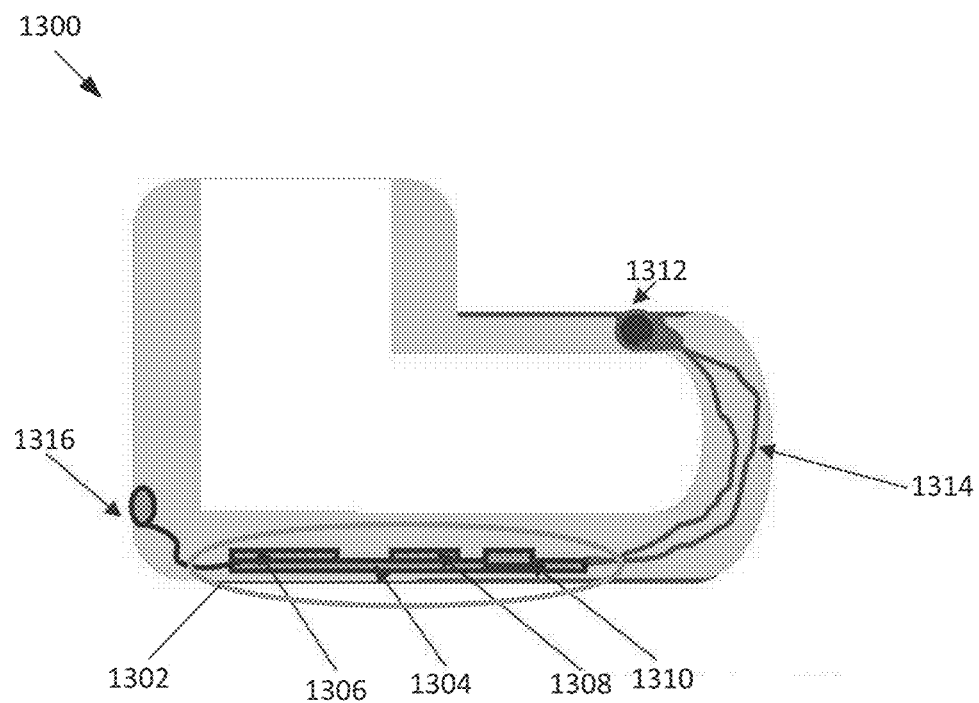
FIG. 13 depicts a cross section side view of a shoe having a self-powered IC package integrated therewith, in accordance with various embodiments of the present disclosure.

FIG. 13 depicts a cross section side view of a shoe 1300 having an IC package 1302 integrated therewith, in accordance with various embodiments of the present disclosure. In embodiments, IC package 1302 may include components 1306-1310 coupled with a flexible substrate 1304. IC package 1302 may be produced through any of the process flows described herein.

Components 1306-1310 may, in some embodiments, include a power generation module to produce electrical power in response to an application of mechanical force thereon (e.g., by stepping). In addition, a power control module may also be included. The power control module may be coupled with the power generation module and may be configured to provide power to other components at operational levels respectively associated with other components of IC package, as well as those components coupled with IC package (e.g., camera 1312 and light 1316, discussed further below). Components 1306-1310 may also include one or more processors along with one or more memory modules coupled with the one or more processors; one or more sensors, such as pressure sensors, heart rate sensors, temperature sensors, global positioning sensors (GPS); one or more wireless communication chips, such as, for example, Bluetooth, Zigbee, wireless USB, cellular communication chip for transmission on a cellular network (e.g., via machine type communication (MTC)), or any other wireless communication medium; or the like.

In embodiments, the one or more memory modules may store a plurality of instructions. The plurality of instructions may, in response to execution by the one or more processors, cause the IC package 1302 to carry out various tasks. For example, in some embodiments, the instructions may cause the IC package to establish a wireless data connection with another computing device via a wireless communication chip, such as any of those described above, or below in reference to FIG. 14. In further embodiments, the instructions may cause the processor to send and/or receive data to/from the another computing device via the wireless data connection.

In some embodiments, the instructions, when executed by the one or more processors, may cause IC package 1302 to initiate transmission of data to the another computing device in response to detecting that the another computing device is farther away from the computing device than a predetermined threshold. For example, the shoe may be a child's shoe that may be configured to initiate communication with a computing device (e.g., a smartphone) of a parent of the child in response to detection that the child is roaming away from the parent. In such embodiments, the data may also indicate a location of the wearable device (e.g., through directional indicators, such as an arrow displayed on the computing device, or GPS coordinates captured by a GPS module of IC package 1306) to enable the parent to quickly locate the child.

In other embodiments, IC package 1302 may also include a vibration generation unit configured to cause IC package 1302 to vibrate. In such embodiments, the instructions, when executed by the one or more processors, may cause the shoe to buzz in response to detecting various conditions. As an example, the instructions may cause IC package 1302 to buzz in response to detection that IC package 1302 has moved beyond a predefined threshold from an object in communication with IC package 1302. Returning to the example above, IC package 1302 may buzz in response to a detection that the child is roaming away from the parent, or vice versa, and may buzz to let the child know of this situation. In another example, the instructions may be configured to cause IC package 1302 to buzz in response to detecting that the wearer has moved away from an object, such as the user's keys, phone, wallet, etc. In still other embodiments, the instructions may be configured to cause IC package 1302 to buzz in response to receipt of data from another computing device. For example, a wearer of the shoes may be navigating to a location via a GPS incorporated into a smartphone of the user and IC package 1302 may be communicatively coupled with the smartphone. Instead of having to constantly view the screen of the smartphone to know when and what direction to turn, the user's left or right shoe may buzz to indicate such information. This may of course entail both shoes having an IC package such as that depicted integrated therewith.

In some embodiments, additional components may be coupled with IC package 1302, such as camera 1312 and light 1316. In such embodiments, the instructions may further be configured to cause a camera feed captured by camera 1312 to be transmitted to another computing device or the light to illuminate in response to detection that the wearable device is farther away from the computing device than a predetermined threshold; or in response to receipt of data from the computing device to cause the light source to illuminate. Returning again to the example above, a parent may be able to cause light 1316 to illuminate or a video feed captured by camera 1312 to be transmitted to the parent in response to transmission of such a request to IC package 1302.

It will be appreciated that the above described embodiments, are merely for illustrative purposes and are not meant to be limiting of this disclosure. In addition, it will also be appreciated that the above described embodiments, could also be integrated with other wearable devices, such as those described elsewhere herein.

Figure 14:
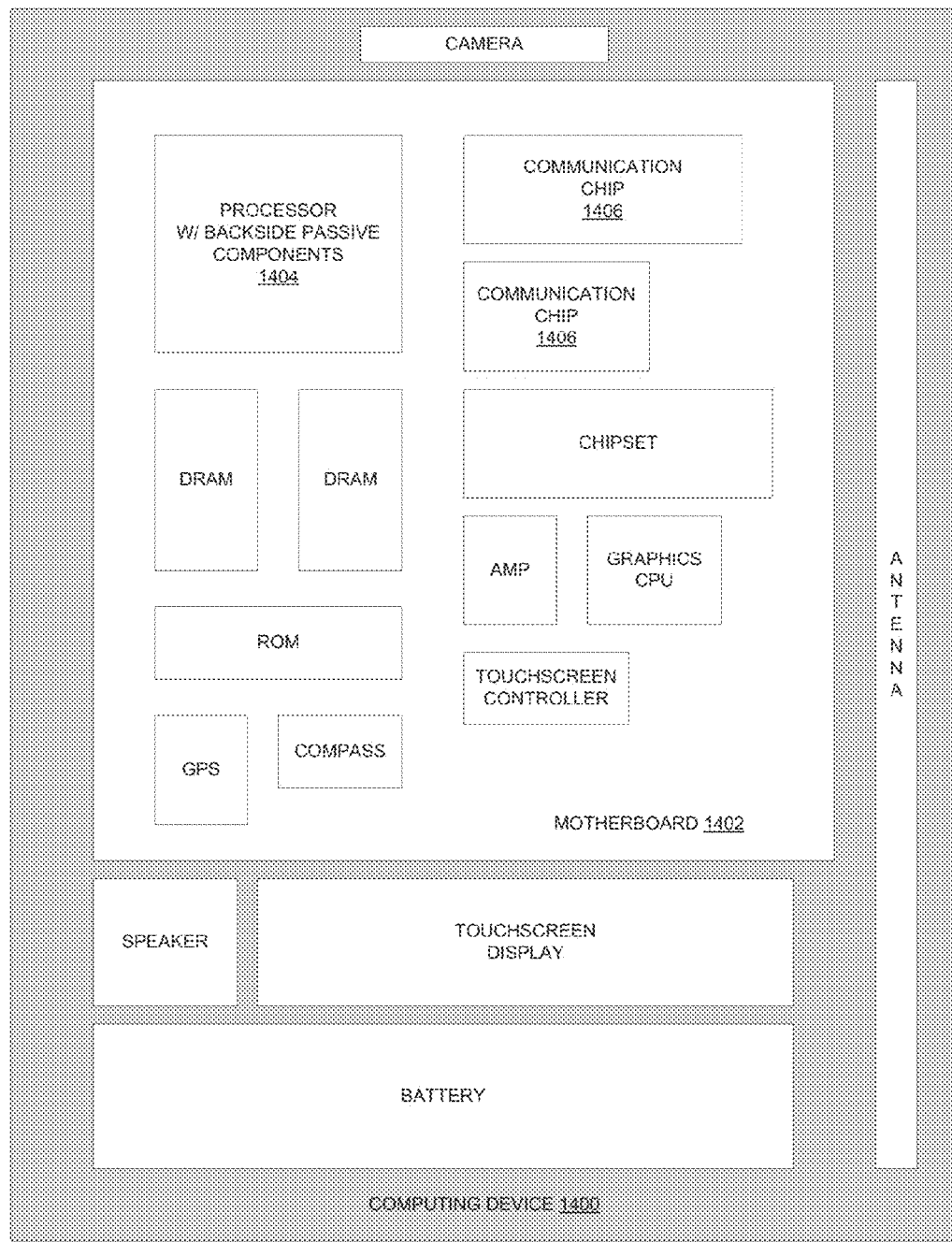
FIG. 14 schematically illustrates a computing device that includes an integrated circuit die, in accordance with various embodiments of the present disclosure.

Embodiments of the present disclosure may be implemented into a system using any suitable hardware and/or software to configure as desired. FIG. 14 schematically illustrates a computing device that includes an IC package (e.g., motherboard 1402 in combination with the components depicted thereon) as described herein, such as that depicted and discussed in reference to FIGS. 1-13. The motherboard 1402 may include a number of components coupled therewith, including but not limited to a processor 1404 and at least one communication chip 1406. The processor 1404 may be physically and electrically coupled to the motherboard 1402. In some implementations, the at least one communication chip 1406 may also be physically and electrically coupled to the motherboard 1402. In further implementations, the communication chip 1406 may be part of the processor 1404.

Depending on its applications, computing device 1400 may include other components that may or may not be physically and electrically coupled to the motherboard 1402. These other components may include, but are not limited to, volatile memory (e.g., dynamic random access memory (DRAM)), non-volatile memory (e.g., read-only memory (ROM)), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 1406 may enable wireless communications for the transfer of data to and from the computing device 1400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1406 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1406 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1406 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1406 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1406 may operate in accordance with other wireless protocols in other embodiments.

The computing device 1400 may include a plurality of communication chips 1406. For instance, a first communication chip 1406 may be dedicated to shorter range wireless communications such as Wi-Fi and Bluetooth and a second communication chip 1406 may be dedicated to longer range wireless communications such as GPS, EDGE, GPRS, CDMA, WiMAX, LTE, Ev-DO, and others.

The processor 1404 of the computing device 1400 may be an IC die incorporated into an IC package assembly. For example, flexible substrate 102 of FIG. 1 may be a motherboard 1402 and the processor 1404 may be one or more IC dies (e.g., one or more of IC dies 104-112 of FIG. 1). The processor 1404 and the motherboard 1402 may be coupled together using package-level interconnects as described herein. The term "processor" may refer to any device or portion of a device that processes electronic data from registers and/or memory to transform that electronic data into other electronic data that may be stored in registers and/or memory.

The communication chip 1406 may also be an IC die (e.g., one or more of IC dies 104-112 of FIG. 1). In further implementations, another component (e.g., memory device or other integrated circuit device) housed within the computing device 1400 may be an IC die (e.g., one or more of IC dies 104-112 of FIG. 1) incorporated into an IC package.

In various implementations, the computing device 1400 may be any type of wearable computing device, such as those discussed above. In such embodiments, all of the components depicted in computing device 1400 may be included in an IC package (e.g., the IC package depicted in FIG. 1) of the wearable computing device or any subset of the components depicted may be communicatively coupled with such an IC package without being physically disposed therein. In further implementations, the computing device 1400 may be any other electronic device that processes data.

EXAMPLES

According to various embodiments, the present disclosure describes a number of examples. Example 1 may include an integrated circuit (IC) package comprising: a flexible substrate; a plurality of dies coupled with the flexible substrate; a first encapsulation material, having a first rigidity, disposed on the flexible substrate at locations on the flexible substrate to at least partially encapsulate each die of the plurality dies; and a second encapsulation material, having a second rigidity, disposed on the flexible substrate, wherein the second rigidity and the first rigidity are different from one another.

Example 2 may include the IC package of Example 1, wherein the second rigidity is less than the first rigidity.

Example 3 may include the IC package of Example 1, wherein the rigidity of the first encapsulation material is designed to prevent delamination of the plurality of dies from the flexible substrate and the rigidity of the second encapsulation material is designed to prevent tearing of the flexible substrate while maintaining a level of flexibility of the flexible substrate.

Example 4 may include the IC package of Example 1, wherein the second encapsulation material at least partially encapsulates the first encapsulation material.

Example 5 may include the IC package of Example 1, wherein the first encapsulation material and the second encapsulation material are disposed on a same side of the flexible substrate.

Example 6 may include the IC package of Example 1, wherein the first encapsulation material is disposed on a first side of the flexible substrate and the second encapsulation material is disposed on a second side of the flexible substrate, and wherein the first side of the flexible substrate is disposed opposite the second side of the flexible substrate.

Example 7 may include the IC package of Example 1, further comprising a third encapsulation material, having a third rigidity, disposed on the flexible substrate, wherein the first rigidity, the second rigidity, and the third rigidity are all different from one another.

Example 8 may include the IC package of Example 1, further comprising electrical routing features that electrically couple at least a first die of the plurality of dies with a second die of the plurality of dies, wherein the electrical routing features are at least partially encapsulated by the second encapsulation material.

Example 9 may include the IC package of Example 1, further comprising one or more interconnect structures disposed in the first encapsulation material or the second encapsulation material, wherein the one or more interconnect structures are electrically coupled with the one or more dies of the plurality of dies via electrical routing features.

Example 10 may include the IC package of Example 9, further comprising a flexible display physically and electrically coupled with the one or more interconnect structures, wherein the electrical routing features are to route electrical signals between the one or more dies and the flexible display.

Example 11 may include the IC package of Example 10, wherein the flexible display is a touchscreen display.

Example 12 may include an assembly comprising: a wearable article; and a wearable device, coupled with the wearable article, wherein the wearable device includes the IC package of any one of Examples 1-11.

Example 13 may include the assembly of Example 12, wherein the wearable article is selected from a group consisting of: a shoe, an orthotic insert, a shirt, shorts, pants, watch, bracelet, necklace, belt, or jewelry.

Example 14 may include the assembly of Example 12, wherein the wearable article is a shoe having at least the IC package of the wearable device disposed in a sole of the shoe.

Example 15 may include the assembly of Example 14, wherein the wearable device further includes: a power generation module to produce electrical power in response to an application of mechanical force thereon; and a power control module, coupled with the power generation module and the plurality of dies of the IC package, to deliver the electrical power produced by the power generation module to the plurality of dies of the IC package at operational power levels respectively associated with the each of the plurality of dies.

Example 16 may include the assembly of Example 12, wherein the plurality of dies include one or more processors, one or more memory modules coupled with the one or more processors, a global positioning sensor (GPS) coupled with the processor, and a wireless communication chip coupled with the processor.

Example 17 may include the assembly of Example 16, wherein the one or more memory modules store a plurality of instructions, wherein the plurality of instructions, in response to execution, cause the wearable device to establish a wireless data connection with a computing device.

Example 18 may include the assembly of Example 17, wherein the instructions further cause the processor to send data to the computing device indicating that the wearable device is farther away from the computing device than a predetermined threshold.

Example 19 may include the assembly of Example 18, wherein the data also indicates a location of the wearable device.

Example 20 may include the assembly of Example 16, wherein the wearable device further comprises a camera, coupled with the one or more processors.

Example 21 may include the assembly of Example 20, wherein the wearable article is a shoe, and wherein the camera is disposed in a toe of a shoe.

Example 22 may include the assembly of Example 16, wherein the wearable device further comprises a light source coupled with the one or more processors.

Example 23 may include the assembly of Example 22, wherein the wearable article is a shoe, and wherein the light source is disposed in an exterior surface of the shoe.

Example 24 may include the assembly of Example 23, wherein the instructions are further to cause the light source to illuminate: in response to detection that the wearable device is farther away from the computing device than a predetermined threshold; or in response to receipt of data from the computing device to cause the light source to illuminate.

Example 25 may include a method of assembling an IC package comprising: coupling a plurality of dies with a flexible substrate; depositing a first encapsulation material, having a first rigidity, on the flexible substrate at locations on the flexible substrate to at least partially encapsulate each die of the plurality dies; and depositing a second encapsulation material, having a second rigidity, on the flexible substrate, wherein the second rigidity and the first rigidity are different from one another.

Example 26 may include the method of Example 25, wherein the second rigidity is less than the first rigidity.

Example 27 may include the method of Example 25, wherein the rigidity of the first encapsulation material is designed to prevent delamination of the plurality of dies from the flexible substrate and the rigidity of the second encapsulation material is designed to prevent tearing of the flexible substrate while maintaining a level of flexibility of the flexible substrate.

Example 28 may include the method of Example 25, wherein the second encapsulation material at least partially encapsulates the first encapsulation material.

Example 29 may include the method of Example 25, wherein depositing the first encapsulation material comprises depositing the first encapsulation on a first side of the flexible substrate, and wherein depositing the second encapsulation material further comprises depositing the second encapsulation on the first side of the flexible substrate.

Example 30 may include the method of Example 25, wherein depositing the first encapsulation material further comprises depositing the first encapsulation material on a first side of the flexible substrate and depositing the second encapsulation material further comprises depositing the second encapsulation material on a second side of the flexible substrate, and wherein the first side of the flexible substrate is disposed opposite the second side of the flexible substrate.

Example 31 may include the method of Example 25, further comprising depositing a third encapsulation material, having a third rigidity, on the flexible substrate, wherein the first rigidity, the second rigidity, and the third rigidity are all different from one another.

Example 32 may include the method of Example 25, further comprising forming electrical routing features to electrically couple at least a first die of the plurality of dies with a second die of the plurality of dies, wherein depositing the second encapsulation material further comprises depositing the second encapsulation material over the electrical routing features to at least partially encapsulate the electrical routing features by the second encapsulation material.

Example 33 may include the method of Example 25, further comprising forming one or more interconnect structures in the first encapsulation material or the second encapsulation material, wherein the one or more interconnect structures electrically couple with the one or more dies of the plurality of dies via electrical routing features.

Example 34 may include the method of Example 33, further comprising physically and electrically coupling a flexible display with the one or more interconnect structures, wherein the electrical routing features route electrical signals between the one or more dies and the flexible display.

Example 35 may include the method of Example 34, wherein the flexible display is a touchscreen display.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An integrated circuit (IC) package comprising:
   a flexible substrate;
   a plurality of dies coupled with the flexible substrate;
   a first encapsulation material, having a first rigidity, disposed on the flexible substrate at locations on the flexible substrate to at least partially encapsulate each die of the plurality dies;
   a second encapsulation material, having a second rigidity, disposed on the flexible substrate, wherein the second rigidity and the first rigidity are different from one another; and
   electrical routing features that electrically couple at least a first die of the plurality of dies with a second die of the plurality of dies, wherein the electrical routing features are at least partially encapsulated by the second encapsulation material.

2. The IC package of claim 1, wherein the second rigidity is less than the first rigidity.

3. The IC package of claim 1, wherein the second encapsulation material at least partially encapsulates the first encapsulation material.

4. The IC package of claim 1, wherein the first encapsulation material and the second encapsulation material are disposed on a same side of the flexible substrate.

5. The IC package of claim 1, wherein the first encapsulation material is disposed on a first side of the flexible substrate and the second encapsulation material is disposed on a second side of the flexible substrate, and wherein the first side of the flexible substrate is disposed opposite the second side of the flexible substrate.

6. The IC package of claim 1, further comprising a third encapsulation material, having a third rigidity, disposed on the flexible substrate, wherein the first rigidity, the second rigidity, and the third rigidity are all different from one another.

7. The IC package of claim 1, further comprising one or more interconnect structures disposed in the first encapsulation material and/or the second encapsulation material, wherein the one or more interconnect structures are electrically coupled with one or more dies of the plurality of dies via electrical routing features.

8. The IC package of claim 1, further comprising a flexible display physically and electrically coupled with one or more interconnect structures, wherein the electrical routing features are to route electrical signals between one or more dies and the flexible display.

9. An assembly comprising:
   a wearable article; and
   a wearable device, coupled with the wearable article, wherein the wearable device includes the IC package of claim 1.

10. The assembly of claim 9, wherein the wearable article is selected from a group consisting of: a shoe, an orthotic insert, a shirt, shorts, pants, watch, bracelet, necklace, belt, or jewelry.

11. The assembly of claim 9, wherein the wearable article is a shoe or an orthotic insert that further includes:
    a power generation module to produce electrical power in response to an application of mechanical force thereon; and
    a power control module, coupled with the power generation module and the plurality of dies of the IC package, to deliver the electrical power produced by the power generation module to the plurality of dies of the IC package at operational power levels respectively associated with the each of the plurality of dies.

12. The assembly of claim 9, wherein the plurality of dies include one or more processors, one or more memory modules coupled with the one or more processors, a global positioning sensor (GPS) coupled with the processor, and a wireless communication chip coupled with the processor.

13. The assembly of claim 12, wherein the one or more memory modules store a plurality of instructions, wherein the plurality of instructions, in response to execution by the one or more processors, cause the wearable device to establish a wireless data connection with a computing device via the wireless communication chip.

14. The assembly of claim 13, wherein the instructions further cause the processor to send data to the computing device indicating that the wearable device is farther away from the computing device than a predetermined threshold.

15. The assembly of claim 14, wherein the data also indicates a location of the wearable device.

16. The assembly of claim 15, wherein the wearable device further comprises a camera, coupled with the one or more processors.

17. The assembly of claim 16, wherein the wearable article is a shoe, and wherein the camera is disposed in a toe of the shoe.

18. The assembly of claim 13, wherein the wearable device further comprises a light source coupled with the one or more processors.

19. The assembly of claim 18, wherein the wearable article is a shoe, and wherein the light source is disposed in an exterior surface of the shoe.

20. The assembly of claim 19, wherein the instructions are further to cause the light source to illuminate:
    in response to detection that the wearable device is farther away from the computing device than a predetermined threshold; or
    in response to receipt of data from the computing device to cause the light source to illuminate.

21. A method of assembling an IC package comprising:
    coupling a plurality of dies with a flexible substrate;
    depositing a first encapsulation material, having a first rigidity, on the flexible substrate at locations on the flexible substrate to at least partially encapsulate each die of the plurality dies;

depositing a second encapsulation material, having a second rigidity, on the flexible substrate, wherein the second rigidity and the first rigidity are different from one another; and providing electrical routing features that electrically couple at least a first die of the plurality of dies with a second die of the plurality of dies, wherein providing electrical routing features includes at least partially encapsulating the electrical routing features by the second encapsulation material.

22. The method of claim 21, wherein the second rigidity is less than the first rigidity.

23. The method of claim 21, wherein depositing the first encapsulation material comprises depositing the first encapsulation on a first side of the flexible substrate, and wherein depositing the second encapsulation material further comprises depositing the second encapsulation on the first side of the flexible substrate.

24. The method of claim 21, wherein depositing the first encapsulation material further comprises depositing the first encapsulation material on a first side of the flexible substrate and depositing the second encapsulation material further comprises depositing the second encapsulation material on a second side of the flexible substrate, and wherein the first side of the flexible substrate is disposed opposite the second side of the flexible substrate.

* * * * *